United States Patent
Gluch et al.

(10) Patent No.: US 7,161,365 B2
(45) Date of Patent: Jan. 9, 2007

(54) APPARATUS AND METHOD FOR MAKING GROUND CONNECTION

(75) Inventors: Josef Gluch, Cary, NC (US); Boris Safin, Augsburg (DE); David Karasiewicz, Raleigh, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/980,301

(22) Filed: Nov. 4, 2004

(65) Prior Publication Data

US 2006/0103369 A1    May 18, 2006

(51) Int. Cl.
*G01R 1/067*    (2006.01)
*G01R 31/28*    (2006.01)

(52) U.S. Cl. ..................... 324/754; 324/765
(58) Field of Classification Search ............... None
See application file for complete search history.

(56) References Cited

U.S. PATENT DOCUMENTS

| 4,731,577 A | * | 3/1988 | Logan ..................... 324/754 |
| 5,304,921 A | | 4/1994 | Cook et al. |
| 5,663,653 A | * | 9/1997 | Schwindt et al. .......... 324/754 |
| 6,496,026 B1 | | 12/2002 | Long et al. |

\* cited by examiner

*Primary Examiner*—Ernest Karlsen
(74) *Attorney, Agent, or Firm*—Edell, Shapiro & Finnan, LLC

(57) ABSTRACT

An apparatus for enabling connection to a ground plane of a test board during the testing of contacts on the board, comprising a conductive ground plate overlying said ground plane having at least one opening which overlies contacts on the board to be tested, the ground plate having a top side and an underside, there being at least one conductive abutment on the underside of the ground plate which contacts the ground plane, whereby connection to the ground plane may be made by contacting the top side of the ground plate during testing of the contacts.

19 Claims, 4 Drawing Sheets

APPARATUS AND METHOD FOR MAKING GROUND CONNECTION

BACKGROUND OF THE INVENTION

The present invention is directed to an apparatus and method for providing an electrical ground connection to a test board.

Contacts on a test board may be in the form of pins, pads, or other mode. When such contacts are contacted to perform a test on the board, it is also necessary for a ground connection to a ground plane of the test board to be made. To produce clear signals, it is desired for the ground path to be as short as possible.

A test board to which the present invention pertains may be used for testing a variety of different types of electrical devices or components. A preferred use for the invention is in connection with test boards which are used to de-bug the electrical characteristics of semiconductor devices. These may be memory chips, or other types of semiconductor devices.

A prior art approach to providing a ground connection in the environment of a test board is to use a cable. However, a cable provides a poor quality signal because of the relatively big inductive loop which it sets up. Another prior art approach is to use a copper paddle which is fixed to a testing probe at one side and is parallel but spaced from the test board so that a capacitive connection is established. However, a capacitive connection is usually not as good as a direct one. Still a further prior art option is to use a test probe with a pogo pin for the ground contact. However, this arrangement is difficult to realize in practice because an automated test system would have to turn the probe for every contact in a way that the ground pin gets to contact a piece of the ground plane of the board. The ground plane, however, is not available at every necessary part of the board.

SUMMARY OF THE INVENTION

In accordance with the present invention, an apparatus for enabling a ground connection to a ground plane of a test board to be made is provided which comprises a conductive ground plate overlying the ground plane and having at least one opening which overlies contacts on the board to be tested, the ground plate having a top side and an underside, and there being at least one conductive abutment on the underside which contacts the ground plane, whereby connection to the ground plane may be made by contacting the top side of the ground plate during the testing of contacts.

BRIEF DESCRIPTION OF DRAWINGS

The invention will be better understood by referring to the accompanying drawings wherein.

DETAILED DESCRIPTION OF PREFERRED EMBODIMENTS

Figure 1:
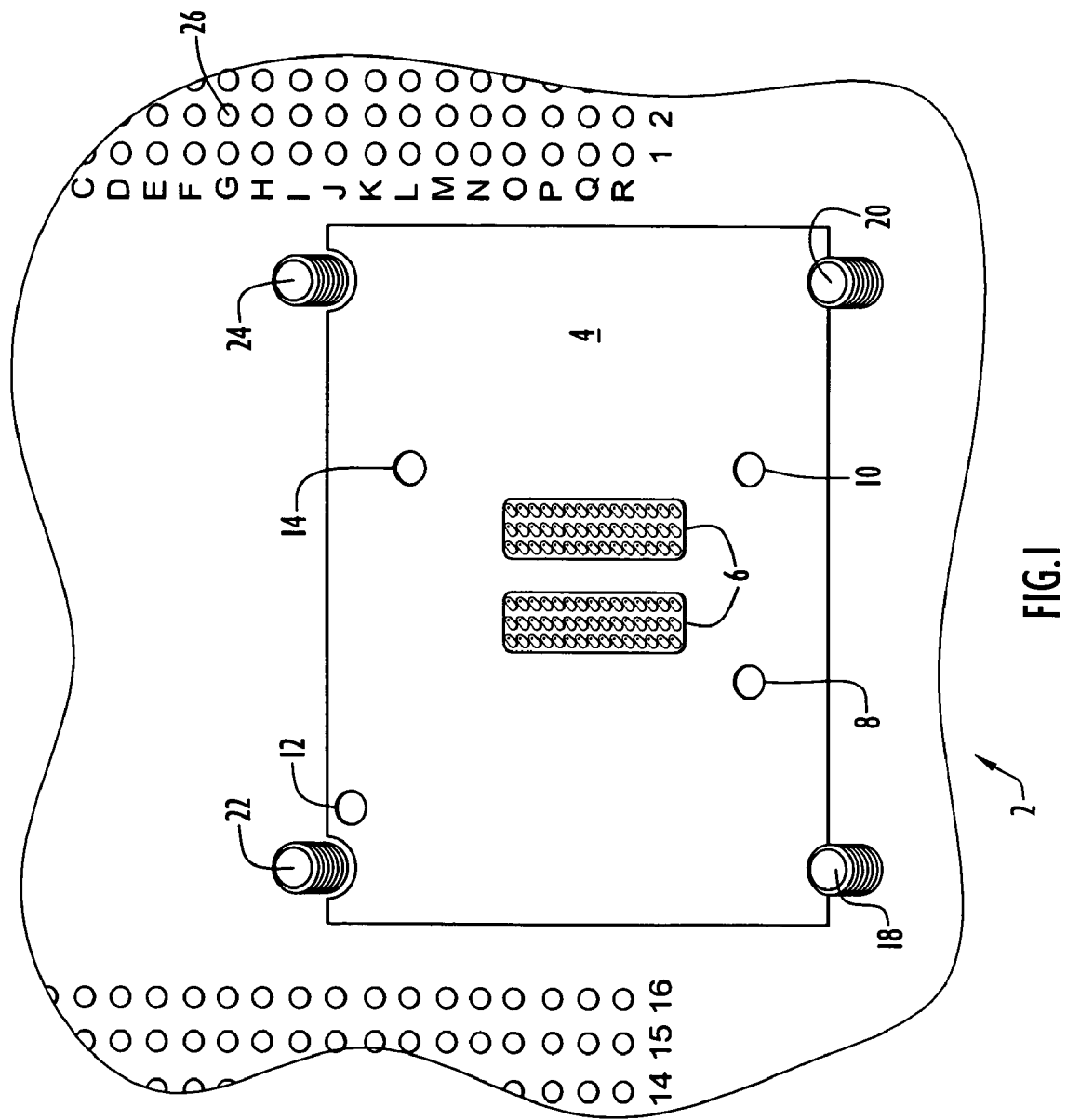
FIG. 1 is a plan view of part of a test board.

Referring to FIG. 1, the layout of test board 2, or a part thereof, is depicted. A ground plane 4 of electrically conductive material is shown near the center of the Figure, and may comprise part of the test board. In order to set up and/or calibrate the test board to prepare it for testing an electrical device or component, contacts on the test board must be electrically accessed. It is possible that these contacts may be very close to each other. In the particular embodiment shown in FIG. 1, the contacts are comprised of pins 6. While the pins 6 are shown as being comprised of two parallel groups of pins, any other configuration is also possible.

Although as previously mentioned, the invention has applicability to a test board for testing any type of electrical device or component, it is particularly applicable to a board which is for testing semiconductor devices. After the test board is calibrated with the use of the present invention, a socket (not shown) may be interfaced with pins 6, and the semiconductor device would be interfaced with the socket, whereupon the semiconductor device would be ready for testing, e.g., to de-bug its electrical characteristics. Alignment holes 8, 10, 12 and 14 are provided to aid in securely mounting the socket on pins 6. Contacts 26 are outside the ground plane and are involved in the setting up of testing circuits.

Figure 2:
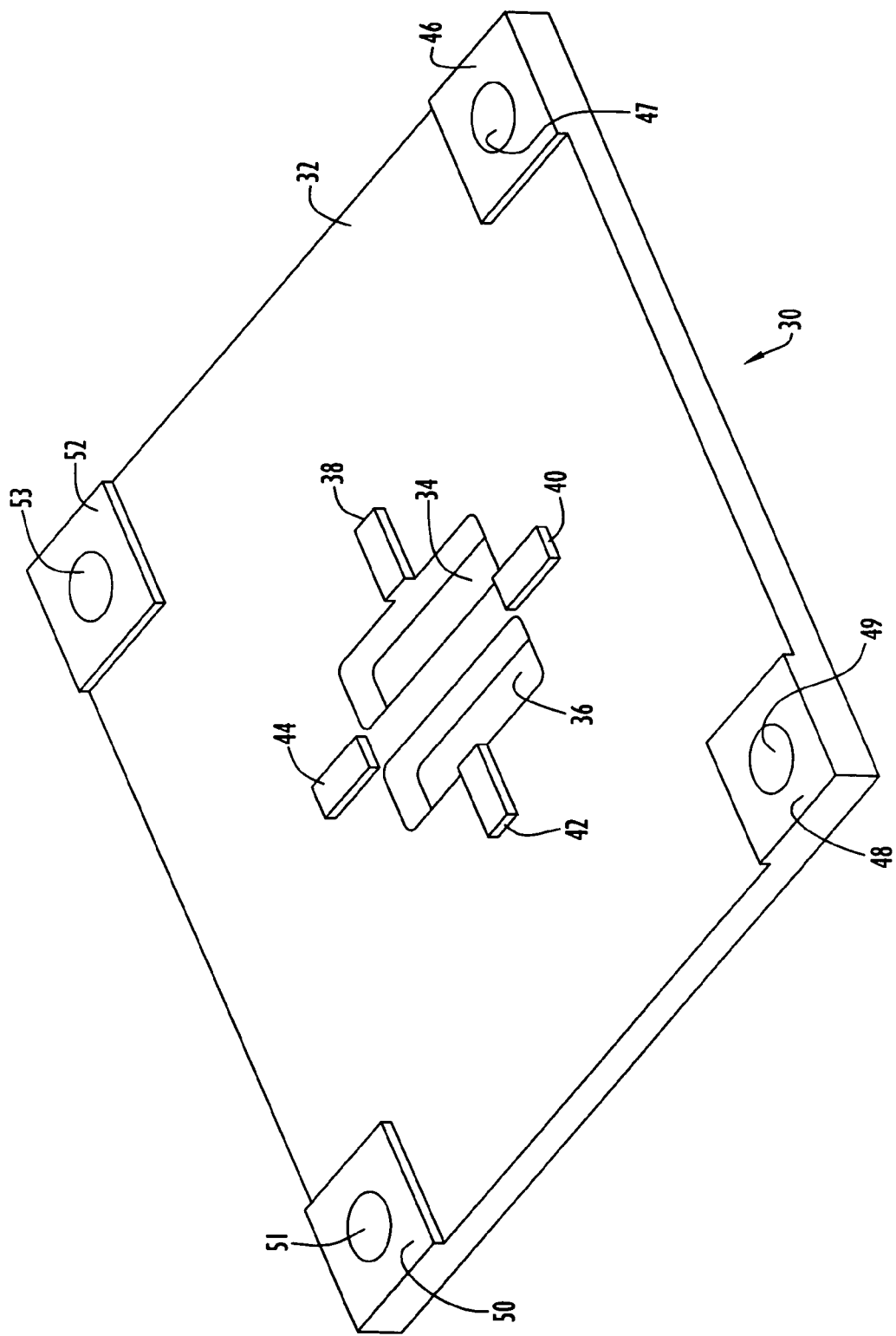
FIG. 2 is a plan view of the underside of an embodiment of a ground plate utilized in the invention.

Referring to FIG. 2, an embodiment of a conductive ground plate 30 is shown. The ground plate has a top side (shown in FIG. 3), and an underside 32, the layout of which is shown in FIG. 2. The ground plate may be made of any conductive material having good conductive characteristics, brass and copper being two such possibilities.

The ground plate has at least one opening for overlying the contacts to be tested. A conductive device, e.g., an electrical probe extends through such opening during the testing process to access the contacts. The opening(s) may be of any size, shape, and number, and such parameters will typically be related to the size and shape of the group(s) of contacts to be tested. In the embodiment shown in FIG. 2, two rectangular openings 34 and 36 which correspond to the two parallel groups of pins of FIG. 1, are provided. At least one conductive abutment is provided on the underside of the ground plate, at location(s) where the ground plane is available, for making sure contact with the ground plane. It is preferable for the abutments to be located individually depending on the available ground plane, as close as possible to the opening and if possible to be distributed around the opening to make the current flow to the ground plane as short as possible.

In the embodiment of FIG. 2, four conductive abutments 38, 40, 42, and 44 are depicted. They are symmetrically located with respect to the opening, and each abutment has a flat underside for making sure contact with the ground plane. The abutments may be separate pieces which are welded to the ground plate, or the entire ground plate may be cast as a single piece.

The invention is in no way limited to the specific arrangement of conductive abutments shown in FIG. 2. Any geometric arrangement of any number of discrete abutments may be used, or there may be a single abutment piece which surrounds the plate opening(s), which for example may be rectangular or curved.

Figure 3:
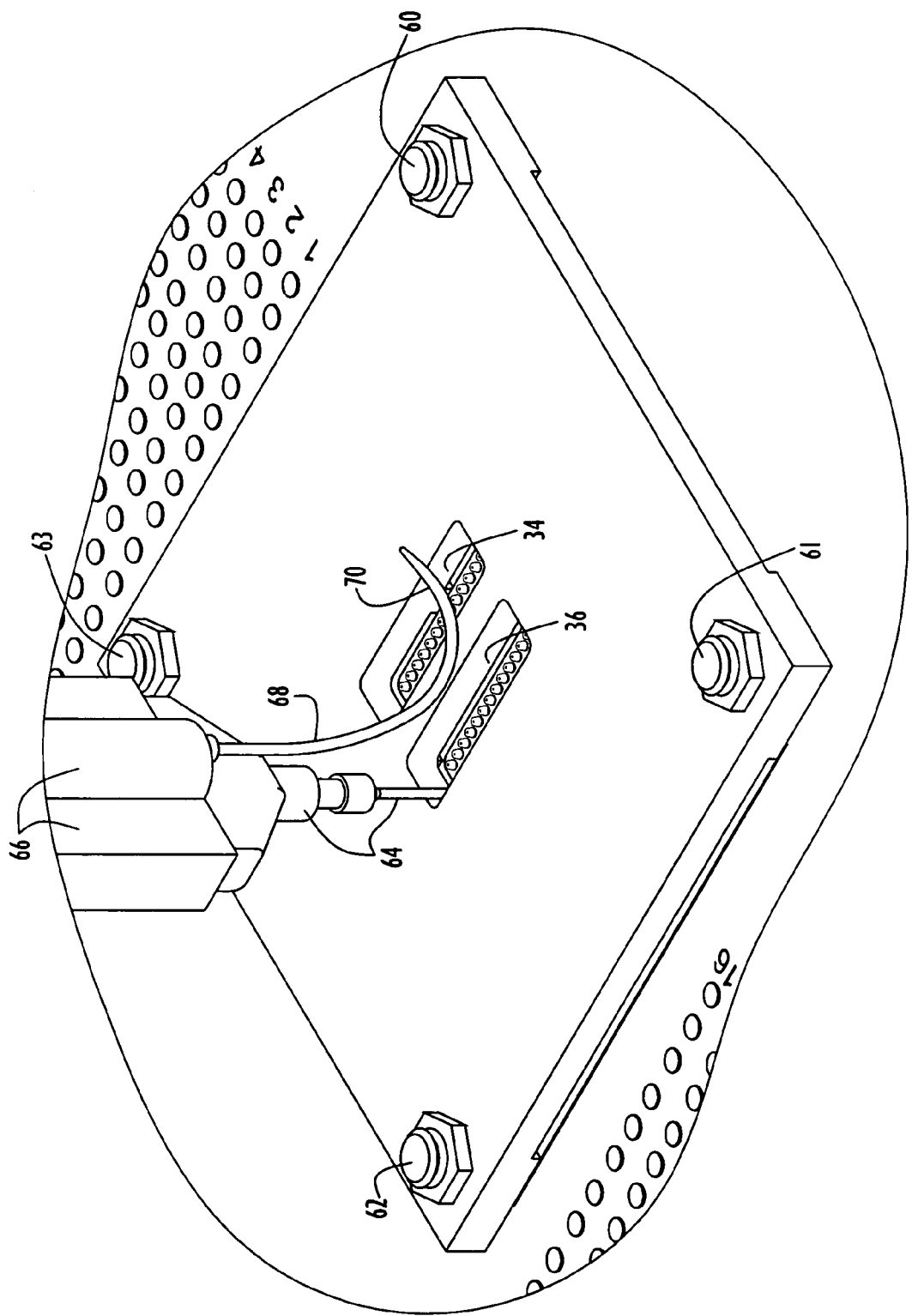
FIG. 3 shows an embodiment of the apparatus of the invention performing a test.

Mounting spacers 46, 48, 50, and 52 may be provided at the corners of the ground plate. The spacers have respective holes 47, 49, 51, and 53 therein for mounting the ground plate to the ground plane via bolts 18, 20, 22, and 24 shown in FIG. 1. Nuts, 60, 61, 62 and 63 which are shown in FIG. 3 may be used to secure the ground plate. The thickness of the spacers is preferably arranged to be slightly less than the thickness of the conductive abutments so as to ensure good contact of the conductive abutments with the ground plane.

FIG. 3 depicts an apparatus in accordance with an embodiment of the invention which is shown in the process of performing a test on the test board. As can be seen, the conductive plate is attached to the test board overlying the ground plane with the openings 34 and 36 overlying the parallel groups of pins. The testing may be automatic, and involve the use of a robot which automatically moves the contacting device 64 of the test equipment from pin to pin in a programmed manner. In the preferred embodiment, the contacting device is an electrical probe. The probe is moved from pin to pin to take the desired measurements, which are fed to test equipment, for example an oscilloscope. Contacting member 68 is also provided, which contacts the top of the ground plate when contacting device 64 takes measurements, to provide a ground connection. The contacting member may be arranged so as to be tensioned against the top of the ground plate in proximity to the opening so as to create a desirable ground connection. Contacting member 68 may be mounted for movement with contacting device 64, for example by being secured to a common mount 66, so that whenever the contacting device is moved to a new pin, a connection to ground is established.

Contacting member 68 may take various forms. In the preferred embodiment, it is simply a stiff metal wire, which may be bent so that it is tensioned against the top of the ground plate. The wire includes cross portion 70, which while contacting the ground plate is long enough to prevent the wire from becoming inserted into one of the openings. The wire is preferably of a metal which is easily spring loaded, and by way of non-limitative example, may be made of brass.

Figure 4:
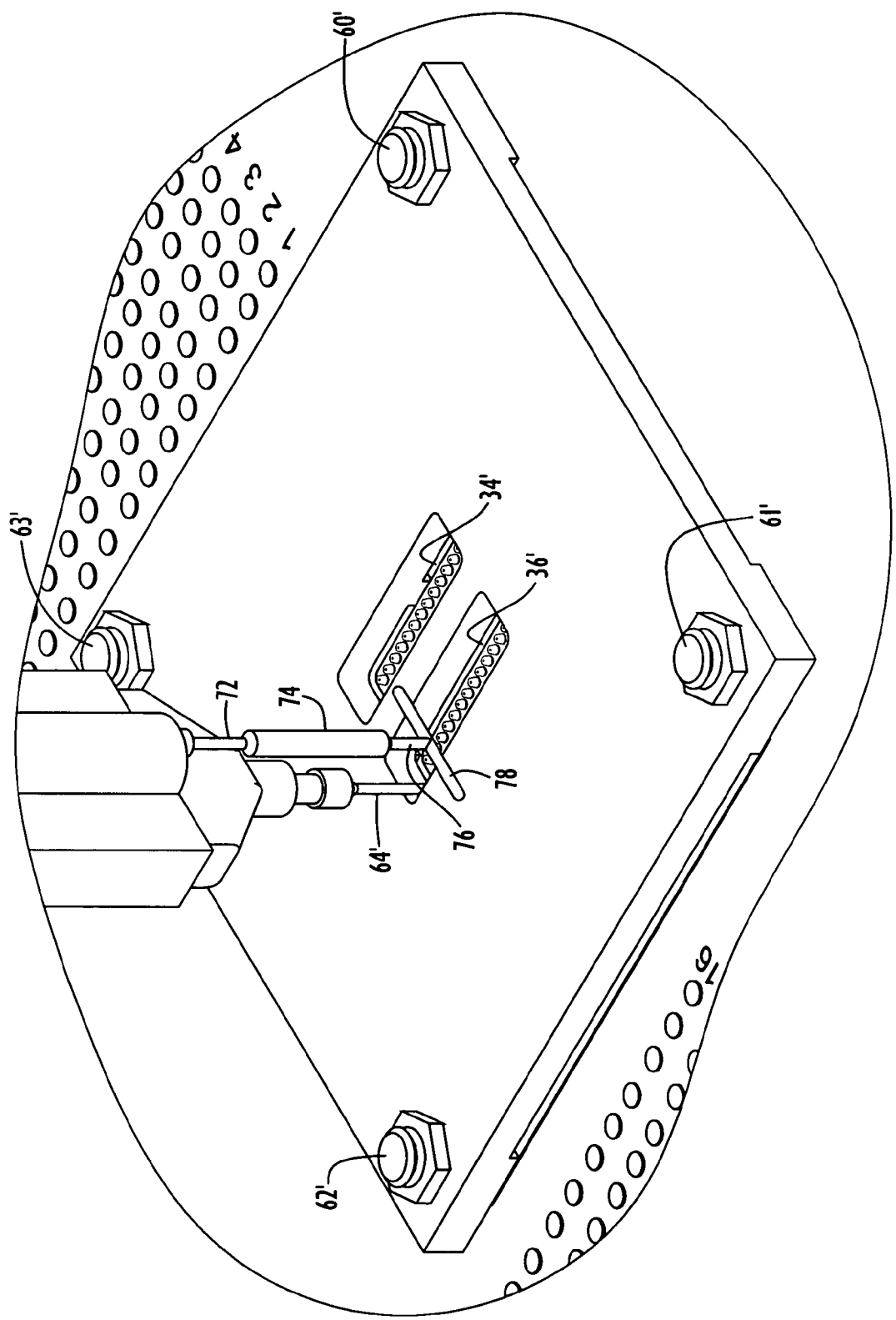
FIG. 4 shows a further embodiment of the apparatus of the invention performing a test.

FIG. 4 shows a further embodiment of the invention where like parts are denoted with primed numerals. FIG. 4 depicts a contacting member 78 which is tensioned by pogo pin 72. The pogo pin includes a conductive barrel 74 which encloses a spring which compressively bears on plunger 76. Contacting member 78 is attached to plunger 76 and is of an orientation and dimension which prevents the unit from becoming inserted into an opening. Thus, the contacting member is tensioned against the top of the ground plate 30.

There thus has been described an apparatus for making a ground connection to a circuit board. Additionally, the invention comprises a method of making such connection, wherein a conductive ground plate having an opening is provided overlying a ground plane in contacting relationship, contacts are contacted through the opening to perform a test, and the top surface of the ground plate is contacted to provide a ground connection.

It should be understood that while the invention has been described in detail and with reference to specific embodiments thereof, it will be apparent to one skilled in the art that various changes and modifications can be made therein without departing from the spirit and scope thereof. Accordingly, it is intended that such modifications and variations of the invention be covered provided they come within the scope of the appended claims and their equivalents.

What is claimed is:

1. An apparatus for making electrical connection to a ground plane of a test board during probing of contacts on the test board, comprising:
   a conductive ground plate overlying said ground plane having at least one opening therein which overlies contacts on the board to be tested, said ground plate having a top side and an underside, there being at least one conductive abutment on the underside of the ground plate which contacts the ground plane;
   a moveable contacting device which is capable of extending through the opening in the ground plate for testing contacts on the test board; and
   a contacting member capable of directly contacting the ground plate and arranged for movement with said contacting device such that the contacting member directly contacts the top side of said ground plate at a different location each time the contacting device is moved to a new position to test a different contact.

2. The apparatus of claim 1 wherein said at least one conductive abutment on the underside of the ground plate is adjacent to the opening in the ground plate.

3. The apparatus of claim 2 wherein said contacting member is arranged to contact the top side of the ground plate adjacent to the opening.

4. The apparatus of claim 3 wherein the ground plane is flat, wherein the underside of said at least one conductive abutment is flat for ensuring good electrical contact with the ground plane, and wherein the exterior surface of the abutment is continuous and uninterrupted.

5. The apparatus of claim 4 wherein on its underside the ground plate has spacers of thickness which space the ground plate from the ground plane a distance such that said at least one conductive abutment is in good electrical contact with the ground plane.

6. The apparatus of claim 5 wherein the spacers are of slightly less thickness than the thickness of said at least one conductive abutment.

7. The apparatus of claim 4 wherein the ground plate is fastened to the ground plane.

8. The apparatus of claim 7 wherein said at least one conductive abutment comprises a plurality of conductive abutments adjacent to the opening.

9. The apparatus of claim 8 wherein said plurality of conductive abutments are situated symmetrically with respect to the opening.

10. The apparatus of claim 8 wherein said at least one opening comprises two adjacent rectangular openings, each having an elongated length dimension and a width dimension.

11. The apparatus of claim 10 wherein the plurality of conductive abutments comprises first and second pairs of abutments, the individual abutments of the first pair facing each other across width dimensions of the openings at about the mid-region of the length dimension and the individual abutments of the second pair facing each other along the length dimensions of the openings at a region, at least part of which, is between the openings.

12. The apparatus of claim 7 wherein the at least one conductive abutment comprises a single continuous abutment surrounding said at least one opening.

13. The apparatus of claim 3 wherein said contacting member comprises a bent wire.

14. The apparatus of claim 13, wherein said bent wire has a portion which extends in a direction generally across said opening and which is dimensioned so it cannot extend into the opening.

15. The apparatus of claim 3 wherein said contacting member is tensioned by a pogo pin.

16. The apparatus of claim 15 wherein said contacting member extends in a direction generally across said opening and is dimensioned so that it cannot extend into said opening.

17. The apparatus of claim 5 wherein the spacers have holes therein for mounting the ground plate on the ground plane.

18. An apparatus for making connection to a ground plane of a test board during the probing of contacts on said test board, comprising a conductive ground plate overlying said ground plane having at least one opening therein which overlies contacts to be tested, said ground plate having a top side and an underside, there being at least one conductive abutment on the underside of the ground plate which contacts the ground plane adjacent to the opening, a moveable probe which is capable of extending through said opening in said ground plate for testing contacts on the test board, and a conductive member which is capable of directly contacting the ground plate and which is mounted for movement with said probe such that it directly contacts the top of the ground plate at a different location adjacent the opening each time the probe is moved to a new position to test a different contact.

19. The apparatus of claim 18 wherein the opening is rectangular having an elongated length and a width and wherein said at least one conductive abutment comprises first and second pairs of abutments, the individual abutments of the first pair facing each other across the width dimension of the opening and the individual abutments of the second pair facing each other across the length dimension of the opening.

* * * * *